United States Patent

Middleton et al.

Patent Number: 6,091,474
Date of Patent: Jul. 18, 2000

[54] DISPLAY ASSEMBLY

[75] Inventors: David Desmond Middleton, Raleigh; Stacy Neil Smith, Apex; Shawn Michael Stephenson, Raleigh, all of N.C.

[73] Assignee: Ericsson, Inc., Research Triangle Park, N.C.

[21] Appl. No.: 08/883,517

[22] Filed: Jun. 26, 1997

[51] Int. Cl.[7] .................................................. G02F 1/1345
[52] U.S. Cl. ............................. 349/149; 439/73; 349/152
[58] Field of Search ..................................... 349/149, 152; 439/59, 62, 66, 74, 73, 71, 260

[56] References Cited

U.S. PATENT DOCUMENTS

| | | | |
|---|---|---|---|
| 3,718,842 | 2/1973 | Abbott, III et al. | 361/681 |
| 3,910,029 | 10/1975 | Yamazaki | 368/84 |
| 3,914,021 | 10/1975 | Nishimura | 349/58 |
| 4,025,162 | 5/1977 | Yagi | 349/58 |
| 4,132,984 | 1/1979 | Gross | 349/149 |
| 4,142,226 | 2/1979 | Mears | 361/785 |
| 4,483,581 | 11/1984 | Kourimsky et al. | 439/634 |
| 4,629,289 | 12/1986 | Streit | 349/149 |
| 4,684,181 | 8/1987 | Massit et al. | 439/59 |
| 4,715,820 | 12/1987 | Andrews, Jr. et al. | 439/59 |
| 4,738,625 | 4/1988 | Burton et al. | 439/59 |
| 5,057,025 | 10/1991 | Klatt et al. | . |
| 5,318,212 | 6/1994 | Becker et al. | 228/44.7 |
| 5,684,549 | 11/1997 | Barth et al. | 439/74 |
| 5,760,862 | 6/1998 | Bachus | 349/149 |
| 5,868,582 | 2/1999 | Jacobi | 439/74 |
| 5,888,076 | 3/1999 | Itoh et al. | 439/67 |

FOREIGN PATENT DOCUMENTS

| | | |
|---|---|---|
| 0 019 667 A1 | 6/1979 | European Pat. Off. . |
| 0817325A1 | 6/1997 | European Pat. Off. . |
| 87 05 715 U | 11/1987 | Germany . |
| 88 05 722 U | 7/1988 | Germany . |

*Primary Examiner*—Kenneth Parker
*Attorney, Agent, or Firm*—Coats & Bennett, P.L.L.C.

[57] ABSTRACT

A mounting assembly is used to mount a liquid crystal display (LCD) to a printed circuit board. The mounting assembly includes a display support which is mounted to the printed circuit board and supports the display in spaced relationship to the printed circuit board. A connector with integral spring contacts snaps into an opening into the display support to electrically connect the contacts on the LCD to the contacts on the printed circuit board. The connector extends over a top surface of the LCD display and functions as a mechanical retention element.

12 Claims, 4 Drawing Sheets

DISPLAY ASSEMBLY

FIELD OF THE INVENTION

The present invention relates generally to assembly structures and methods for mounting a liquid crystal display on a printed circuit board, and, more particularly, to a new mounting assembly and method for connecting the terminals of the liquid crystal display to corresponding terminals on the printed circuit board.

BACKGROUND OF THE INVENTION

Liquid crystal displays (LCDs) are commonly employed in mobile telephones to display information to the user. An LCD typically comprises liquid crystal composites disposed between upper and lower substrates. Display elements are formed by etching a conductive film deposit on the inner surface of each substrate. Etched areas become the display background, unetched areas become the display elements. When a voltage potential is applied, the display elements become visible.

Numerous methods have been used in the past to connect the electrical contact points on the LCD with the contact points on a printed circuit board or other electrical circuit. One such method is to directly solder conductive leads extending from the LCD to the circuit board. This approach, however, has several drawbacks. The LCD is fragile and stiff soldered leads can break the glass upon impact. The use of soldered contacts also necessitates an extra soldering process on the assembly line. Finally, it is difficult to remove or replace the LCD after it has been soldered in place.

Another approach which has been employed in the past is to use an elastomeric connection (i.e., zebra strip) to connect the LCD to the printed circuit board. An elastomeric connection typically comprises a strip of elastomer material having embedded contacts. A guide is used to hold the elastomeric strip which is compressed between the LCD and the printed circuit board. This approach also has several limitations. First, elastomers have a practical aspect ratio limit that causes connections to be unreliable if that limit is exceeded. Second, this connection method requires careful attention to counter-balancing the elastomer compression to prevent continuous stress on the LCD glass. Cleanliness of the parts is also critical to this design. Finally, this approach works best only when the LCD contacts are on the back side of the LCD (i.e., facing the printed circuit board). If the contacts are on the top side of the LCD glass, then an elastomeric connector is very difficult to implement. In this case, the elastomer would have to wrap around to the top side of the glass and would require that compression be maintained on the top side of the LCD, as well as between the LCD and printed circuit board.

A third approach which has been used in the past is an elastomer and connector block combination. This type of connector system typically comprises a C-shaped connector block clipped and glued to the LCD with an elastomer connecting the block to the printed circuit board. One problem with this approach is that the connector block can be easily shifted due to insufficient adhesion to the LCD glass and cannot be placed with tight tolerances. In addition, the connector block and elastomer combination relies on an additional contact interface presenting more opportunities for defects. The signal must pass from the printed circuit board to the elastomer, from the elastomer to the connector block, and from the connector block to the LCD. This extra interface is also a source of an additional layer of tolerances. This design also adds costs due to the use of two connectors.

A fourth approach to the problem of connecting an LCD to a printed circuit board is to use a flex-film. Two types of flex-film connections are generally used—soldered/heat-sealed connections and zero insertion force (ZIF) connectors. In both instances, a flex-film is permanently attached to the LCD and the tail of the flex-film is connected to the printed circuit board, either permanently via soldering or heat-sealing, or preferably through a ZIF connector mounted on the printed circuit board. One problem associated with flex-film is that it sometimes entails tedious routing of the flex-film during the assembly process. While the soldering and heat-sealing can be implemented on automated assembly lines, this requires additional equipment and processing. Flex-films employing ZIF connectors usually cannot be automated. ZIF connectors also introduce an extra contact interface which represents additional opportunity for defects in production. The signal must pass from the printed circuit board to the ZIF connector, from the ZIF connector to the flex-film, and from the flex-film to the LCD. This extra contact interface is also a source of an additional layer of tolerances. This method also adds costs due to additional parts.

Accordingly, there is a need for a new type of LCD connection system to enable connections to be quickly and easily made between an LCD and a printed circuit board where the contacts are disposed on an upwardly facing surface of the LCD.

SUMMARY OF THE INVENTION

The present invention comprises a mounting assembly for mounting and electrically connecting an LCD to a printed circuit board when the contacts on the LCD are disposed on the top side of the LCD. The LCD is mounted on a support structure which, in turn, is mounted on the printed circuit board. A single connector with integral spring contacts snaps into the support structure. The integral spring contacts connect the contacts on the top side of the LCD to the contacts on the printed circuit board. The connector not only provides electrical contact between the LCD and printed circuit board, but also provides mechanical retention of the LCD.

The present invention has numerous advantages over the prior art. First, only a single connector is needed so there are fewer interfaces between the LCD and printed circuit board. The mounting assembly is suitable for both hand assembly and for automated assembly. The connector is very durable and locks itself into place so that the electrical connection is less likely to be broken.

Other objects and advantages of the present invention will become apparent and obvious from a study of the following description and the accompanying drawings which are merely illustrative of such invention.

DETAILED DESCRIPTION OF THE INVENTION

Figure 1:
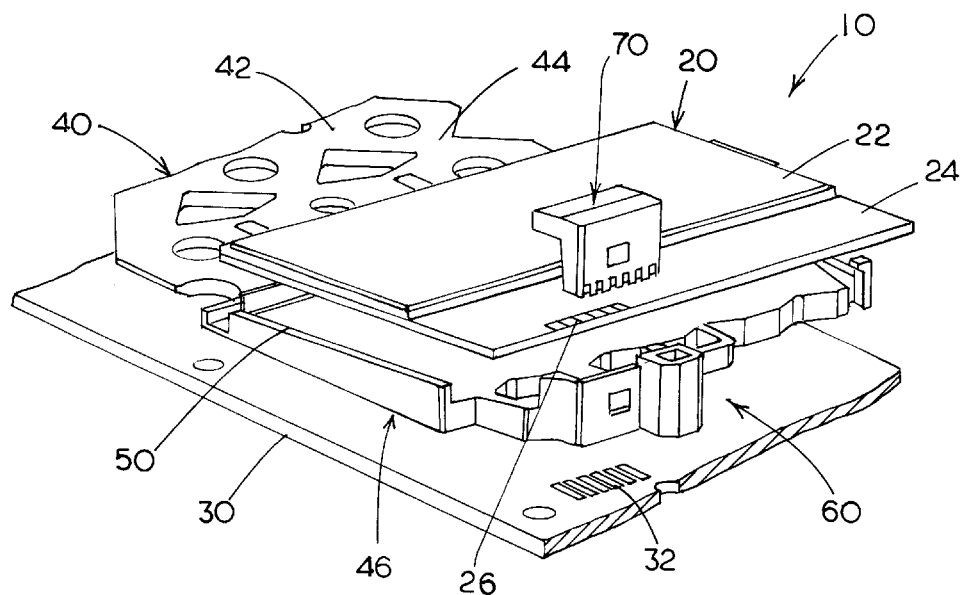
FIG. 1 is a perspective view of the LCD mounting assembly of the present invention.

Referring now to the drawings, and particularly to FIG. 1, the LCD mounting assembly is shown therein and indicated generally by the numeral 10. The mounting assembly 10 of the present invention is particularly adapted to mount and electrically connect an LCD 20 to a printed circuit board 30 when the electrical contacts on the LCD 20 face away from the printed circuit board 30. The mounting assembly 10 comprises a single connector 70 with integral spring contacts which connect the electrical contacts on the LCD 20 to the contacts on the printed circuit board 30. The connector 70 snaps into a light guide 40 or other support for the LCD and provides mechanical retention of the LCD 20 in addition to providing electrical contact.

Figure 2:
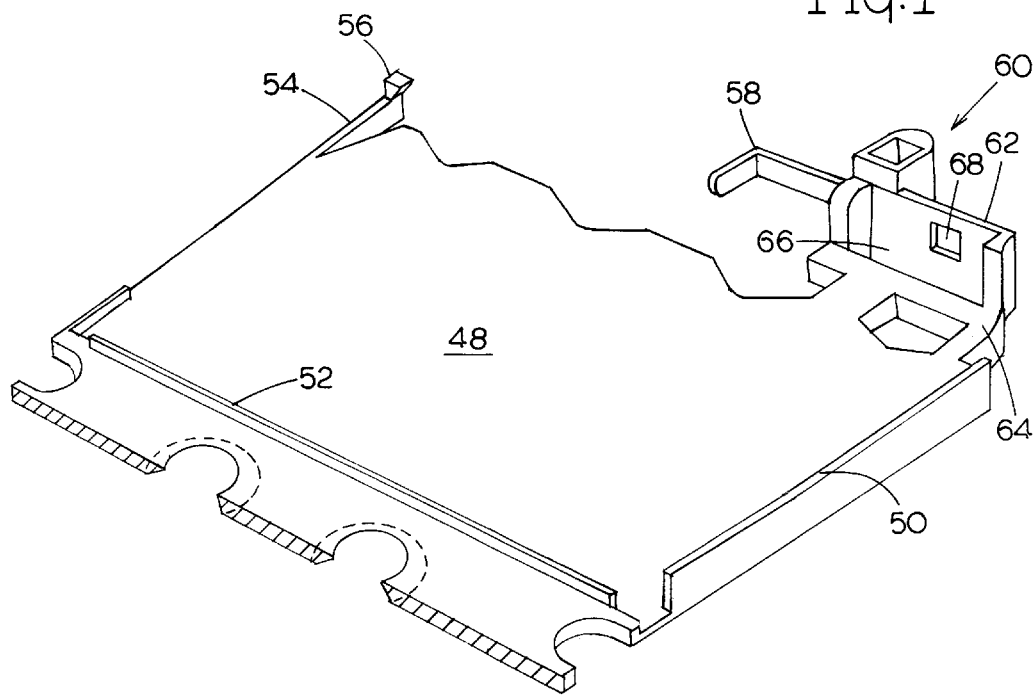
FIG. 2 is a partial perspective view of the light guide which forms a part of the mounting assembly.

Referring now to FIG. 2, the construction of a light guide 40 suitable for use in connection with the present invention is shown. The light guide 40 comprises the generally planar base member 42 and an integrally formed retaining structure 60 which forms a receptacle for the connector 70. The base member 42 includes a keypad portion 44 and a display portion 46. The light guide 40 is constructed of a transparent, plastic material which serves as a light transmission medium.

The display portion 46 of the base member 42 has a generally flat, though slightly inclined mounting surface 48 for the LCD 20. A first locating stop 50 is disposed along a right edge of the mounting surface 48. A second locating stop 52 extends along the bottom edge of the mounting surface 48. Together, the locating stops 50 and 52 provide x-y location for the LCD 20 on the mounting surface 48.

When the LCD 20 is placed on the mounting surface 48, the LCD 20 is urged by spring fingers 54 and 58 against the locating stops 50 and 52. Finger 54 is disposed along the left edge of the mounting surface 48 and includes a tab 56 which engages the edge of the LCD 20. Finger 58 has an L-shaped configuration and forms a part of the retaining structure 60. Finger 58 pushes against a top edge of the LCD 20 to urge the LCD 20 firmly against the locating wall 52.

The retaining structure 60 is integrally formed with the base member 42 and is disposed along the top edge of the base member 42. The retaining structure 60 includes a channel-shaped retaining wall 62 which is connected to a projecting portion 64 of the base member 42. The retaining wall 62 defines a vertically extending opening 66 into which the connector 70 fits.

Figure 4:
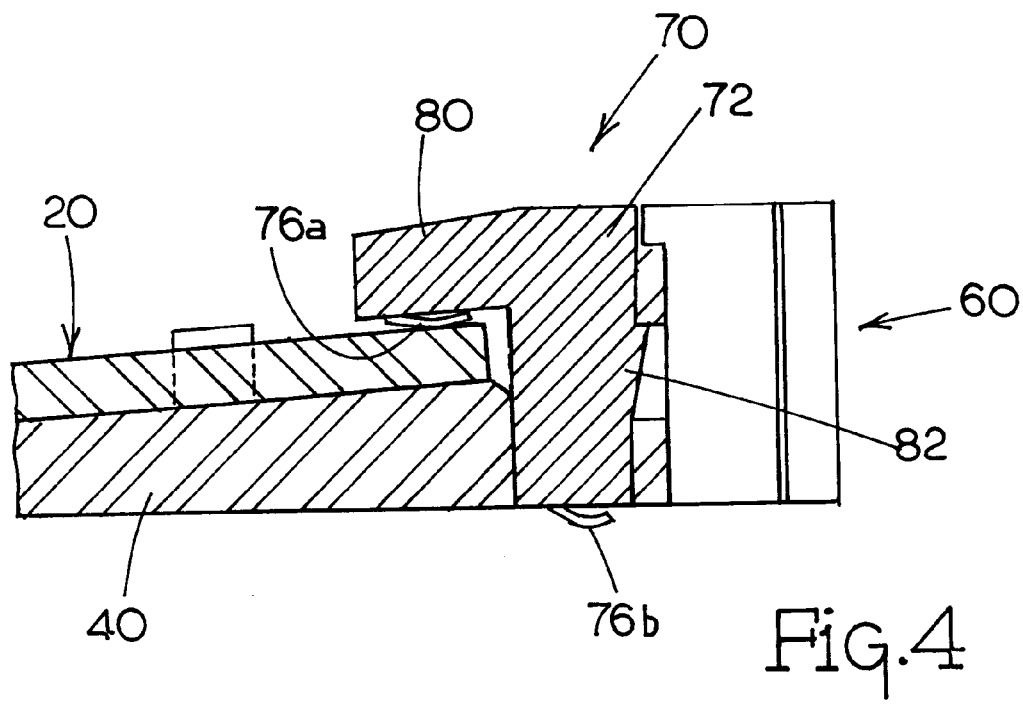
FIG. 4 is a section view of the entire mounting assembly.
Figure 3:
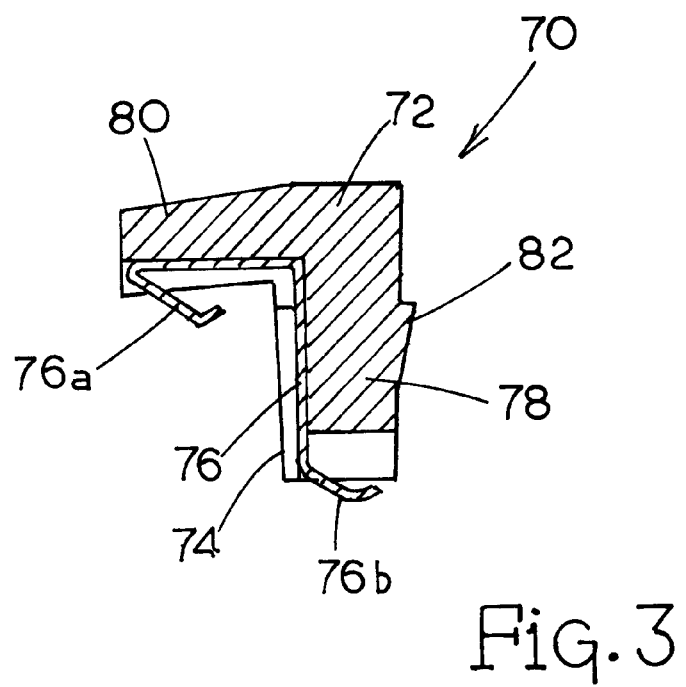
FIG. 3 is a section view of the connector which forms a part of the mounting assembly.

The connector 70 is shown in FIGS. 3 and 4. The connector 70 includes a generally L-shaped connector body 72 having a plurality of parallel channels or grooves 74 to hold a series of spring contacts 76. Alternatively, the spring contacts 76 can be insert molded in the connector 70. Each of the spring contacts 76 includes a first end 76a which engages an electrical contact 26 on the LCD 20, and a second end 76b which engages an electrical contact 32 on the printed circuit board 30. The spring contacts 76 are made from a resilient, conductive material which can be deformed and still return to its original state. The resiliency of the spring contacts 76 assures that the spring contacts 76 will remain engaged with the electrical contacts 26 and 32 on the LCD 20 and printed circuit board 30 respectively.

The connector body 72 includes an insert portion 78 and a top portion 80. The insert portion 78 is sized and shaped to fit into the connector opening 66 in the light guide 40. A locking tab 82 on the insert portion 78 of the connector body 72 engages with a locking hole 68 in the retaining wall 62 of the light guide 40. The locking tab 82 and locking hole 68 are designed to prevent removal of the connector 70 from the light guide 40 after the connector 70 has been inserted into the connector opening 66. Other retention mechanisms may be employed such as press fitting, gluing, bonding, welding, etc.

The top portion 80 of the connector body 72 extends generally horizontally over the top surface of the LCD 20 to position the spring contacts 76 for engagement with the electrical contacts 26 on the LCD 20. The spring contacts 76 also provides mechanical retention for the LCD 20. That is, once the connector 70 is inserted into the light guide 40, the LCD 20 is locked in place on the mounting surface 48.

In use, the light guide 40 is mounted to the printed circuit board 30 in a conventional manner which is well known to those skilled in the art. The LCD 20 is then placed on the mounting surface 48 of the light guide 40. Spring fingers 54 and 58 in conjunction with the locating walls 50 and 52 provide x-y location for the LCD 20. Once the LCD 20 is properly located on the light guide 40, the connector 70 is inserted into the connector opening 66 of the light guide 40. The tapered configuration of the locking tab 82 allows insertion of the connector 70 while preventing removal after the locking tab 82 is engaged in the locking hole 68. The spring contact 76 of the connector 70 establishes a direct electrical connection between the electrical contacts 26 of the LCD 20 and the electrical contacts 32 of the printed circuit board 30. The resiliency of the spring contact 76 assures that this electrical connection will be maintained.

Figure 5:
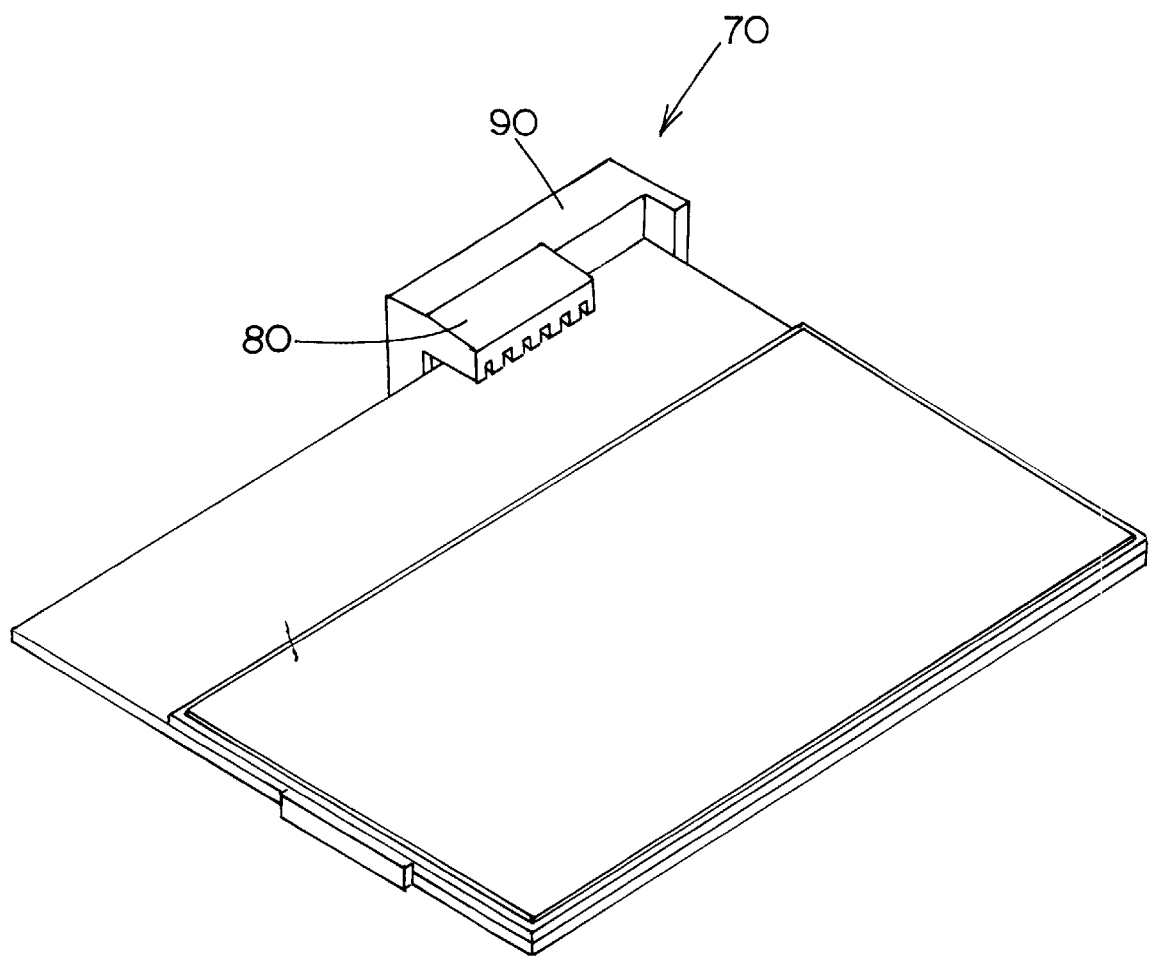
FIG. 5 is a perspective view showing an alternate embodiment of the connector.

Referring now to FIG. 5, an alternate embodiment of the connector 70 is shown. In the embodiment shown in FIG. 5, the connector 70 includes an L-shaped wing 90 which extends around one corner of the LCD 20. The purpose of the L-shaped wing is to locate the connector relative to the LCD 20. This design would improve assembly tolerances in the x-y directions and would provide additional support for the LCD 20. Use of the connector shown in FIG. 5 would require some modification to the light guide 40 to accept the connector.

Figure 6:
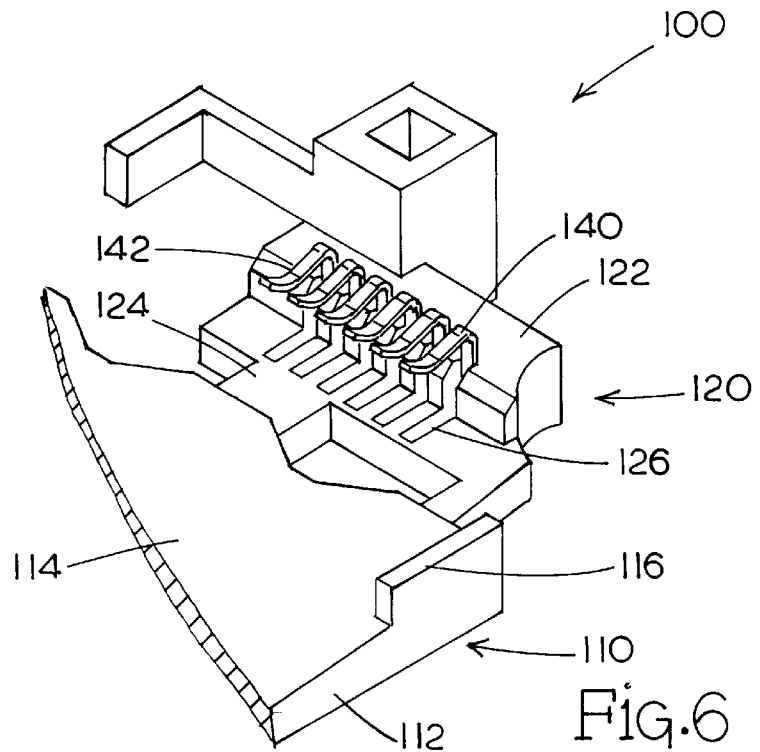
FIG. 6 is a perspective view showing an alternate embodiment of the mounting assembly.
Figure 7:
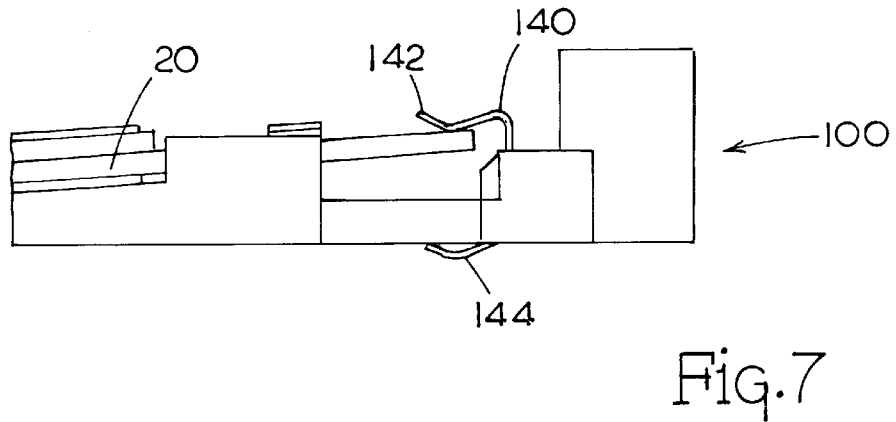
FIG. 7 is an elevation view showing the alternate embodiment of the mounting assembly.
Figure 8:
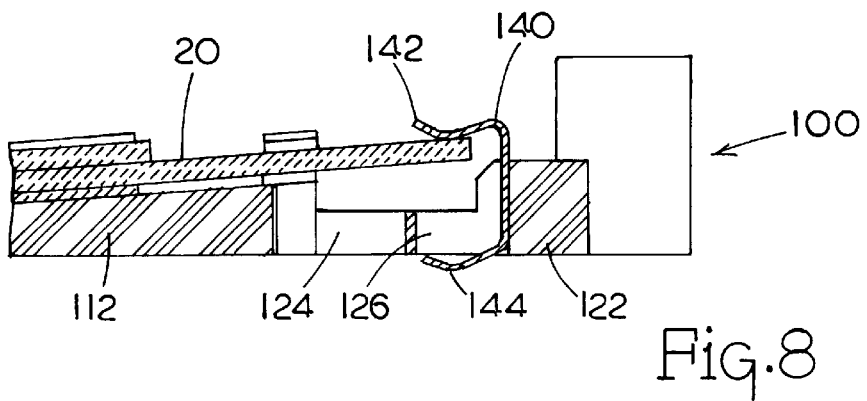
FIG. 8 is a cross-section showing the alternate embodiment of the mounting assembly.

Referring now to FIGS. 6 through 8, an alternate embodiment of the mounting assembly is shown and indicated generally by the numeral 100. The mounting assembly 100 includes a light guide 110 which includes a display portion 112 as previously described. The display portion 112 includes a generally flat mounting surface 114 on which the LCD 20 is supported. A locating wall 116 is disposed along the right edge of the mounting surface 114. A similar locating wall (not shown) would also be located along the bottom edge of the mounting surface 114 for locating the LCD 20 as previously described.

A display retaining structure 120 is integrally formed at the top end of the display portion 112. The retaining structure 120 includes a support block 122 which is attached by connecting members 124 to the display portion 112. This support block 122 includes a series of slots 126 which extend vertically through the support block 122. A series of conductive elements 140 are fixedly secured within the slots 126 of the support block 122. The conductive elements 140 include a first end 142 which extends over the top surface of the LCD 20 to engage the electrical contacts on the LCD 20, and a second end 144 which extends below the bottom surface of the light guide 110 to engage the electrical contacts on the printed circuit board 30. The tip of the first end 142 is bent upward to facilitate insertion of the LCD 20.

In use, the LCD 20 is mounted by inserting the top edge of the LCD 20 beneath the conductor elements 140 with the bottom edge slightly raised. The LCD 20 is then slid underneath the conductor elements 140 while the bottom edge of the display 20 is lowered onto the mounting surface 114. As the LCD 20 slides under the conductor elements 140, the first end 142 of the conductor elements 140 flex upwardly and press against the top surface of the LCD 20. Thus, the conductor elements 140 help retain the LCD 20 in place.

Based on the foregoing, it is apparent that the present invention provides a much improved method for mounting an LCD or other electronic display. The conductor elements provide a direct connection between the electrical contacts on the LCD and the printed circuit board without introducing additional interfaces or tolerances. The present invention is well suited for either manual or automated assembly procedures. Moreover, the assembly does not introduce an extra step, such as a soldering step, into the assembly process. The flexibility of the conductor elements provides a mechanical retention feature and further assures that the conductor elements will remain engaged with the contacts on the LCD and printed circuit board.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claim is:

1. A display assembly comprising:
   a. a substrate including a first set of electrical contacts;
   b. a display support mounted to said substrate, said display support including an opening;
   c. a display panel mounted to said display support having a first surface disposed against said display support and a second surface facing away from said display support, said display panel further including a second set of contacts on said second surface; and
   d. a connector adapted to insert into said opening in said display support with said display panel mounted on said display support, said connector including a connector body and one or more resilient contacts which electrically connect said first and second sets of contacts when the connector is inserted into said opening.

2. The display assembly according to claim 1 wherein said resilient contacts on said connector urge the display panel into contact with the display support.

3. The display assembly according to claim 2 further including a mechanical interlock mechanism for locking the connector within the opening in the display support.

4. The display assembly according to claim 3 wherein the mechanical interlock mechanism comprises a locking tab on said connector body which engages with the display support.

5. The display assembly according to claim 1 further including positioning means for positioning the display panel on the display support.

6. The display assembly according to claim 5 wherein said positioning means comprises a stop disposed along one edge of said display panel and a resilient finger which presses against the opposite edge of said display panel to urge the display panel into contact with the stop.

7. A mounting assembly for mounting an electronic display having a first set of contacts to a substrate having a second set of contacts, said mounting assembly comprising:
   a. a display support which mounts to said substrate, said display support including a display mounting surface for supporting said display in spaced relation to the substrate;
   b. a connector opening formed in said display mount; and
   c. a connector adapted to insert into said connector opening in said display support with the display mounted to said display support, said connector including a connector body and one or more resilient contacts which electrically connect said first and second sets of contacts when the connector is inserted into said opening.

8. The display assembly according to claim 7 wherein said resilient contacts on said connector urge the display panel into contact with the display support.

9. The display assembly according to claim 8 further including a mechanical interlocking mechanism for locking the connector within the connector opening in the display support.

10. The display assembly according to claim 9 wherein the mechanical interlocking mechanism comprises a locking tab on said connector body which engages with the display support.

11. The display assembly according to claim 7 further including positioning means for positioning the display panel on the display support.

12. The display assembly according to claim 11 wherein said positioning means comprises a stop disposed along one edge of said display panel and a resilient finger which presses against the opposite edge of said display panel to urge the display panel into contact with the stop.

* * * * *